(12) United States Patent
Erlat et al.

(10) Patent No.: US 9,472,783 B2
(45) Date of Patent: Oct. 18, 2016

(54) BARRIER COATING WITH REDUCED PROCESS TIME

(75) Inventors: Ahmet Gun Erlat, Niskayuna, NY (US); George Theodore Dalakos, Niskayuna, NY (US); Brian Joseph Scherer, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 1898 days.

(21) Appl. No.: 12/577,629

(22) Filed: Oct. 12, 2009

(65) Prior Publication Data

US 2011/0086183 A1 Apr. 14, 2011

(51) Int. Cl.
| | | |
|---|---|---|
| *H05H 1/24* | (2006.01) | |
| *H01L 51/52* | (2006.01) | |
| *C23C 16/00* | (2006.01) | |
| *B05D 1/00* | (2006.01) | |

(52) U.S. Cl.
CPC ............. *H01L 51/5256* (2013.01); *B05D 1/60* (2013.01); *H01L 2251/5346* (2013.01); *H01L 2251/558* (2013.01)

(58) Field of Classification Search
CPC .......................... C23C 16/00; H01L 51/5237
USPC .............................................. 427/248.1, 569
See application file for complete search history.

(56) References Cited

U.S. PATENT DOCUMENTS

| | | |
|---|---|---|
| 3,932,693 A | 1/1976 | Shaw et al. |
| 4,540,763 A | 9/1985 | Kirchhoff |
| 4,552,791 A | 11/1985 | Hahn |
| 4,842,893 A * | 6/1989 | Yializis ............... B05D 1/60 427/251 |
| 5,185,391 A | 2/1993 | Stokich, Jr. |
| 5,462,779 A | 10/1995 | Misiano et al. |
| 5,654,084 A | 8/1997 | Egert |
| 5,683,757 A | 11/1997 | Iskanderova et al. |
| 5,736,207 A | 4/1998 | Walther et al. |
| 5,757,126 A | 5/1998 | Harvey, III et al. |

(Continued)

FOREIGN PATENT DOCUMENTS

| | | |
|---|---|---|
| EP | 0026973 | 8/1980 |
| EP | 0181649 | 9/1985 |

(Continued)

OTHER PUBLICATIONS

Zhang et al. Permeation of Oxygen and Water Vapor Through EVOH Films as Influenced by Relative Humidity, 2001, Journal of Applied Polymer Science, vol. 82 pp. 1866-1872.*

(Continued)

*Primary Examiner* — Kelly M Gambetta
(74) *Attorney, Agent, or Firm* — Jean K. Testa; Fletcher Yoder, P.C.

(57) ABSTRACT

The present techniques provide systems and methods for protecting electronic devices such as organic light emitting devices (OLEDs) from adverse environmental effects using a thin film encapsulation with reduced process time. In some embodiments, the process time of forming a graded barrier over the OLED structure may take less than 5 minutes, and may result in substantially similar barrier properties as those of metal and epoxy sealants and/or typical thin film encapsulations. The process time of forming the barrier may be reduced by increasing deposition rates for organic and/or inorganic materials, reducing the thicknesses of organic and/or inorganic layers, and/or varying the number of zones in the barrier.

9 Claims, 2 Drawing Sheets

(56) References Cited

U.S. PATENT DOCUMENTS

| | | | |
|---|---|---|---|
| 5,998,803 A | 12/1999 | Forrest et al. | |
| 6,023,371 A | 2/2000 | Onitsuka et al. | |
| 6,097,147 A | 8/2000 | Baldo et al. | |
| 6,146,225 A * | 11/2000 | Sheats | H01L 51/5256 445/24 |
| 6,268,695 B1 | 7/2001 | Affinito | |
| 6,291,116 B1 | 9/2001 | Wolk et al. | |
| 6,413,645 B1 | 7/2002 | Graff et al. | |
| 6,522,067 B1 | 2/2003 | Graff et al. | |
| 6,576,351 B2 | 6/2003 | Silvernail | |
| 6,642,652 B2 | 11/2003 | Collins et al. | |
| 6,777,871 B2 | 8/2004 | Duggal et al. | |
| 7,015,640 B2 | 3/2006 | Schaepkens et al. | |
| 7,425,166 B2 | 9/2008 | Burt et al. | |
| 7,432,184 B2 | 10/2008 | Hosokawa et al. | |
| 7,432,201 B2 | 10/2008 | Takehara et al. | |
| 2005/0221121 A1 | 10/2005 | Ishihara et al. | |
| 2006/0001040 A1* | 1/2006 | Kim et al. | 257/100 |
| 2006/0003189 A1* | 1/2006 | Kim et al. | 428/704 |
| 2007/0048451 A1 | 3/2007 | White et al. | |

FOREIGN PATENT DOCUMENTS

| | | |
|---|---|---|
| EP | 0182336 | 5/1986 |
| JP | 2004098525 | 8/2004 |

OTHER PUBLICATIONS

AQUATRAN Model 1 Specification sheet, 2008, MOCON, Inc. pp. 1-4.*

H. Suzuki et al., Near-Ultroluminescence from Polysilances 331 Thin Solid Films 64-70 (1998).

Gijsbert Jan Meeusen, "Plasma Beam Deposition of Amorphous Hydrogenated Silicone", Thesis, University of Eindhoven, pp. 16-19 (1994).

Bastiaan Arie Korevaar, Integration of Expanding Thermal Plasma Deposited Hydrogenated Amorphous Silicone in Solar Cells, Thesis, University of Eindhoven, pp. 23-34 (2002).

V.J. Law et al., "RF Probe Technology for the Next Generation of Technologival Plasmas", J. Phys. D: Appl. Phys., 34, 2726-2733 (2001).

* cited by examiner

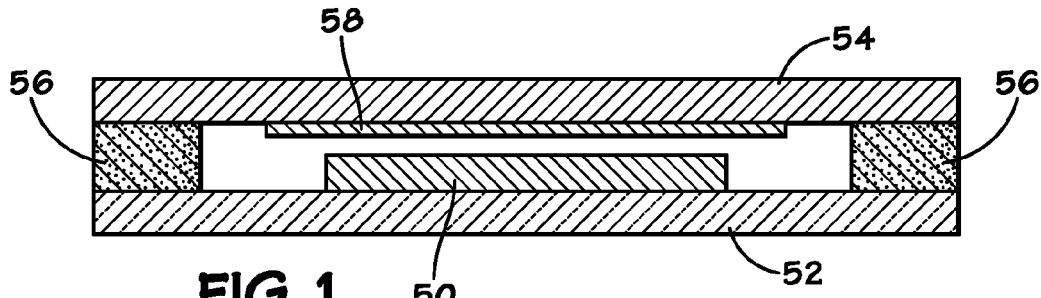
FIG. 1
FIG. 2
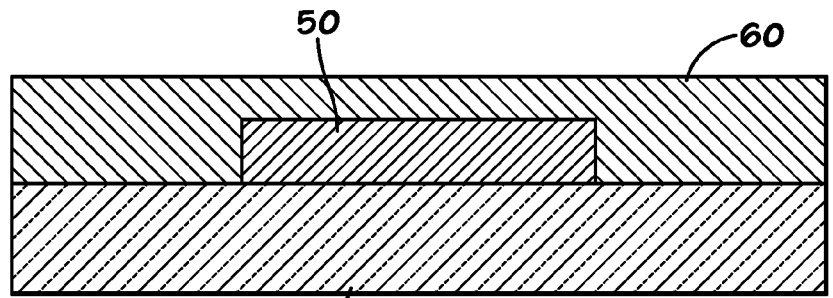
FIG. 3

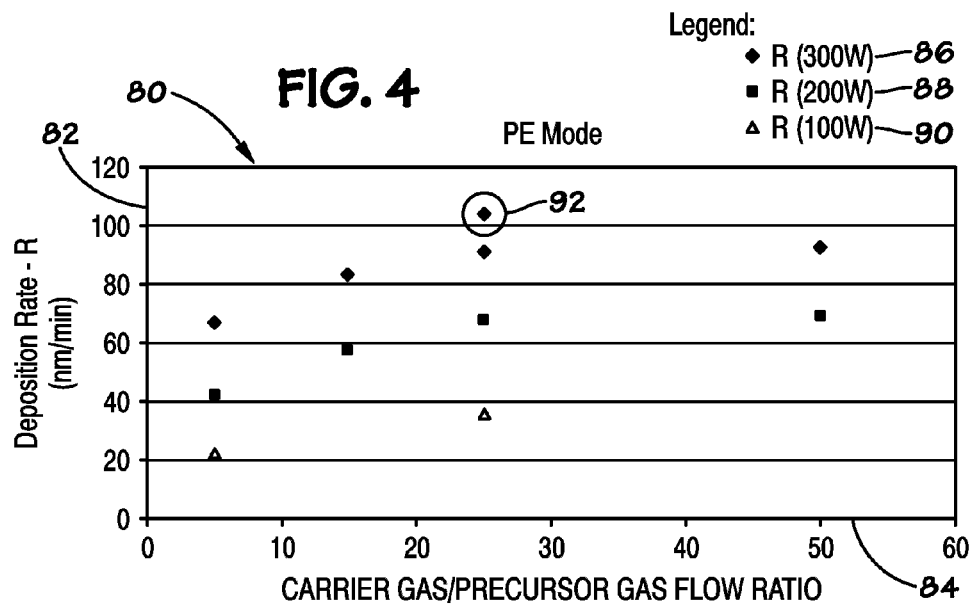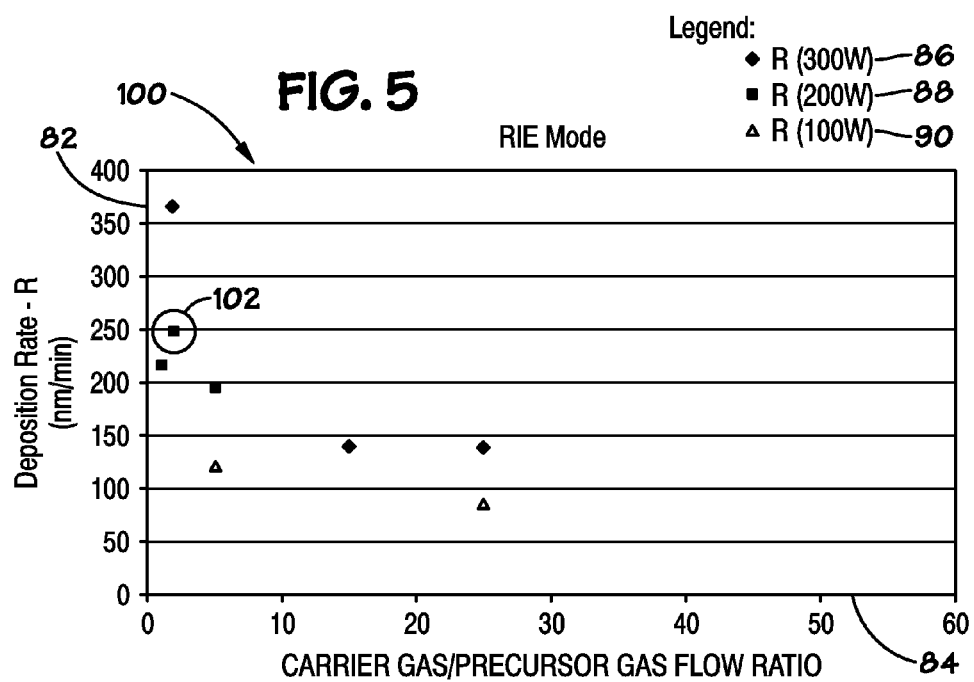

BARRIER COATING WITH REDUCED PROCESS TIME

BACKGROUND

The present techniques relates generally to electronic devices. More specifically, the techniques relate to methods and systems for sealing structures in electronic devices.

Certain electronic devices have components that may be sensitive to adverse environmental conditions, primarily to water vapor and oxygen. For example, display devices are commonly used as screens or displays for a wide variety of electronic devices, including televisions, portable and desktop computers, and handheld devices, such as cellular telephones, personal data assistants, and media players. The display components of such devices may display images by producing patterns of light in response to electrical signals. The patterns of light, or the images and graphics formed by the display device may be formed by individual light emitting structures, such as organic light emitting diodes (OLEDs). OLEDs may be optoelectronic devices having several layers of organic materials, and may include a pair of electrodes, and multiple layers of electroluminescent materials between the electrodes. For example, an OLED may typically include a substrate, an anode, a hole-transporting layer made of an organic compound, an organic luminescent layer with suitable dopants, an organic electron transporting layer, and a cathode.

Light emitting structures, including OLEDs, may be prone to degradation under certain environmental conditions such as oxygen, moisture, chemicals, or other contaminants. For example, water vapor and oxygen ingress over time may cause degradation of light emitting polymers, undesired reactions at the electrode-organic layer interfaces, corrosion of metals, or undesired migration of ionic species, etc. Such degradation may result in the growth of dark spots, delamination, and/or the shrinking of the emissive areas of the light emitting structure. Thus, dark spots, delamination, and/or shrinking of the emissive areas of such structures may affect the quality and/or uniformity of the image displayed.

To minimize the degradation of light emitting structures, the structures may be hermetically sealed with barrier materials to protect against adverse environmental conditions. For example, glass and metal caps with epoxy sealants and desiccants are typically used to seal the structures. However, such encapsulation methods may not be the most cost effective methods for sealing the structures. Other methods of reducing degradation may include thin film encapsulation, such as a graded ultra high barrier (UHB) technology. However, the process time (i.e., the time required to fully encapsulate a light emitting structure) for thin film encapsulation, may be longer than the process time when using a typical glass and epoxy encapsulation process.

BRIEF DESCRIPTION

An embodiment of the present techniques provides a method of forming a barrier, including depositing substantially organic materials to form an organic zone or zones at an organic material deposition rate greater than 25 nm/min. The method further includes depositing substantially inorganic materials to form an inorganic zone or zones, such that the water vapor transmission rate through the barrier comprising organic zone or zones and the inorganic zone or zones is less than $10^{-3}$ g/m$^2$/day, as measured in an environment having a temperature between approximately 20° C. to 60° C. and a relative humidity between approximately 1% RH to 100% RH. Further, there may be a transitional time lag period prior to establishing the steady water vapor transmission rate.

Another embodiment provides a method of encapsulating an electronic device on a substrate. The method includes depositing substantially organic materials at a selected deposition rate greater than 25 nm/min. The substantially organic materials form part of a barrier encapsulating one or more of the electronic device and the substrate.

Yet another embodiment provides a method of depositing a barrier over an electronic device, including forming the barrier in 20 minutes or less. The barrier includes one or more zones of substantially inorganic and substantially organic materials and substantially protects the light emitting structure from adverse environmental conditions.

Some embodiments provide methods of depositing a barrier over an electronic device, and forming the barrier in five minutes or less. The barrier includes one or more zones of substantially inorganic and substantially organic materials and substantially protects the light emitting structure from adverse environmental conditions.

One more embodiment of the present techniques provides a graded barrier consisting of one or more organic zones of organic materials and one or more inorganic zones of inorganic materials deposited in 20 minutes or less. Another embodiment provides similar graded barrier deposited in 5 minutes or less. The barrier is configured to substantially protect an electronic device from environmental conditions.

DRAWINGS

These and other features, aspects, and advantages of the present invention will become better understood when the following detailed description is read with reference to the accompanying drawings in which like characters represent like parts throughout the drawings, wherein:

FIG. 1 is a cross-sectional depiction of an organic light emitting diode (OLED) device encapsulated in metal and/or glass cap;

FIG. 2 is a cross-sectional depiction of an OLED device encapsulated with an ultra high barrier (UHB), in accordance with embodiments of the present techniques;

FIG. 3 is a table comparing the deposition rates and film thicknesses of a thin film encapsulation process with the deposition rates and film thicknesses of an encapsulation process having a reduced process time, in accordance with embodiments of the present techniques;

FIG. 4 is a graph illustrating deposition rates under different power conditions across a range of carrier gas to precursor ratios in a plasma enhanced (PE) deposition mode, in accordance with embodiments of the present techniques; and FIG. 5 is a graph illustrating deposition rates under different power conditions across a range of carrier gas to precursor ratios in a reactive ion etch (RIE) deposition mode, in accordance with embodiments of the present techniques.

DETAILED DESCRIPTION

One or more embodiments of the present techniques will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system related and business-related constraints, which may vary from one implementation to another. Moreover, it should be appreciated that such a development effort might be complex and time consuming, but would nevertheless be a routine undertaking of design, fabrication, and manufacture for one of ordinary skill having the benefit of this disclosure.

The present techniques generally relate to providing a barrier coating for a structure in an electronic device against adverse environmental conditions. For example, the present techniques may apply to devices such as display devices, electrochromic devices, liquid crystal displays, organic light emitting diodes, light emitting diodes, photovoltaic devices, radiation detectors, sensors, integrated circuits, component(s) of medical diagnostic systems, or any combinations thereof. Elements in such devices may be sensitive to environmental conditions. For instance, a device using a display, such as a cellular phone, desktop computer, area lighting application, signage, etc. may include an array of light emitting structures, such as organic light emitting diodes (OLEDs), light emitting diodes (LEDs), etc. As previously discussed, light emitting structures such as OLEDs may be prone to degradation under certain environmental conditions such as oxygen, moisture, chemicals, or other contaminants, which may cause reaction with the organic materials within each OLED structure, undesired reactions at the electrode-organic layer interfaces, corrosion of metals, or undesired migration of ionic species, etc. Degradation may result in the growth of dark spots, or the shrinking of the emissive areas of the OLED structure. In display devices having multiple OLED structures (e.g., an array of OLEDs illuminating the display area), degradation of the OLED structures may affect the image displayed by the device. For example, dark spots or shrinking of the emissive areas of OLED structures may affect the quality and/or uniformity of the image displayed.

To minimize the degradation of electronic devices or structures, such as OLEDs, the structures may be hermetically sealed with barrier materials to protect against adverse environmental conditions. Typically, glass and metal caps with epoxy sealants and desiccants may be used to seal the structures. As depicted in the cross-sectional illustration of an OLED structure 50 in FIG. 1, the structure 50 may be coupled to a substrate 52, generally glass, and may be encapsulated in a metal and/or glass cap 54. The sides of the structure 50 may be sealed with an epoxy material 56, and the encapsulation may also include a desiccant material 58. However, such encapsulation methods may not be the most cost effective methods for sealing the structures.

Other methods of reducing degradation may include thin film encapsulation. For example, graded composition coating, such as a graded ultra high barrier (UHB), may be used as a more cost effective alternative to sealing with glass or metals caps using epoxy and desiccants. As depicted in the cross-sectional illustration of an OLED structure 50 in FIG. 2, the structure 50 may be encapsulated with a barrier 60. As used herein, the OLED structure 50 may refer to any light emitting structure with electroluminescent material(s) sandwiched between two electrodes (e.g., an anode and a cathode), and may have a power source attached to the electrodes. The electroluminescent material(s) may include a phosphorescent or fluorescent material where electroluminescence is produced as a result of electron hole pair recombination. The electroluminescent material(s) may be configured to emit light at a spectrum which may depend on the intended application. The electroluminescent material(s) may comprise one or more materials. The materials may be an electron-transporting material, a hole-transporting material, or another material or combination of materials that support hole-electron recombination. The structure 50 may also include one or more layers of electroluminescent material(s) to generate a desired spectrum of light.

The substrate 53 of the OLED structure 50 may include organic and/or inorganic solids, and may be rigid or flexible. The substrate 53 materials may include glass, plastic, plastic with a barrier coating, metal, ceramic, semiconductor, metal oxide, semiconductor oxide, semiconductor nitride, or combinations thereof. Substrates 53 may be a homogenous mixture of materials, a composite of materials, or multiple layers of materials, and may either be light transmissive or opaque, depending on the intended direction of light emission. For example, transparent glass or plastic may be employed for viewing light emission through the substrate 53.

The barrier 60 may also be referred to as a diffusion-barrier coating having a low diffusion rate, and may be capable of providing substantially low permeability to reactive species such as water vapor and oxygen. The barrier 60 may comprise one or more coating(s) of various materials, including organic or inorganic materials, or any combination materials, including zones where organic and inorganic materials are graded. One example of the barrier 60 is a multi-zone graded barrier. However, in accordance with the present techniques, reducing process time for a diffusion barrier coating may also be applied to other barrier configurations, such as single layer barrier coatings, or any other coating that provides substantially low permeation for reactive species. For example, the barrier 60 may have a water vapor transmission rate (WVTR) of below $10^{-3}$ g/m²/day, and in some embodiments, the WVTR may be below $10^{-4}$ g/m²/day.

Barrier materials may include organic materials, inorganic materials, and/or ceramic materials and combinations thereof. For example, organic materials may comprise carbon, hydrogen, oxygen, and optionally other minor elements, such as sulfur, nitrogen, silicon, etc., depending on the types of reactants. Inorganic and ceramic coating materials typically comprise oxide, nitride, carbide, boride, or combinations thereof of elements of Groups IIA, IIIA, IVA, VA, VIA, VIIA, IB, and IIB, metals of groups IIIB, IVB, and VB, and rare-earth metals. Further examples of materials and combinations, and other details of one type of graded composition barrier, are disclosed in U.S. Pat. No. 7,015,640, herein incorporated by reference.

Depending on the configuration of a device having OLED structures and/or the configuration of the OLED structures 50, the barrier 60 may be deposited directly on the substrate 53 or may be formed or disposed on the surface of the substrate 53, or may be used to encapsulate the structure 50 or both the substrate 53 and the structure 50. Further, varying the relative supply rates or changing the identities of the reacting species can result in a barrier 60 having zones of varying thicknesses, which may also be graded, as may be desired for some applications. For example, a barrier 60 may have zones of inorganic materials (e.g., SiN) and organic materials (e.g., SiOC). The zones of inorganic and organic materials may have graded transitions in some embodiments, and in some embodiments, the barrier 60 may have zones which are not graded, or may have varying number of zones. One type of barrier 60 may have one or more inorganic zones, and none, or any number of organic zones. For example, a barrier 60 with five zones may have zones of organic and inorganic materials adjacent to one another. In some embodiments, a barrier 60 may also include a buffer layer.

As discussed, a barrier may substantially provide a barrier to the permeation of reactive species such as chemicals, water, water vapor and/or oxygen, and may be more cost effective than a glass and epoxy coating. However, the time required to fully encapsulate a light emitting structure, referred to as the "process time," may be longer in thin film encapsulation than in other techniques. The process time for fully encapsulating a structure with the barrier 60 may be greater than the process time when using a typical glass and epoxy coating, as in FIG. 1, for example. While the process time of a typical glass and epoxy coating may be less than 5 minutes, the process time of a typical thin film encapsulation may be approximately 29 minutes. In one embodiment, reducing the process time of a thin film encapsulation may enable a more viable "takt time" (i.e., a cycle time) for fabricating a thin film encapsulation.

In one or more embodiments of the present techniques, a process for encapsulating a device 50 in a barrier coating may be accomplished in a reduced time compared to previous barrier encapsulation processes, while still maintaining barrier properties. More specifically, the encapsulation process of a device 50 may include variations in the number and thicknesses of zones (e.g., organic, inorganic, or transition zones), variations in the deposition rates, and/or variations in the transition zones. In accordance with the present techniques, forming a graded composition barrier with reduced process time may take less than 5 minutes (e.g., 2.5 minutes, in some tests), as compared to a typical thin film encapsulation process, which may take approximately 29 minutes. Thus, the present techniques may be more cost efficient than typical metal and epoxy/desiccant sealing methods, and more time efficient than other thin film encapsulation methods.

Table 70 of FIG. 3 compares various parameters of forming a typical graded barrier (e.g., UHB) with those of forming a graded barrier with reduced process time. Example parameters of forming the graded composition barrier coating with reduced process time, also referred to as a "reduced process time barrier," are presented in the first column 72, while parameters for a typical thin film encapsulation (such as UHB) are presented in the second column 74. As seen in the column 74, the process time of a typical graded composition barrier may be approximately 29 minutes. This process time may be affected by the rate at which different zones are deposited on a substrate 53 (as in FIG. 2) or over an OLED structure 50 and the thicknesses of the barrier zones. Further, the process time may also be affected by the number of zones in the graded barrier.

While the deposition rate of an organic zone for a typical thin film encapsulation process may be about 25 nm/min, deposition of organic materials in a reduced process time barrier may be increased to over 50 nm/min. For example, to produce a barrier with substantially decreased process time while substantially maintaining barrier properties, the organic materials deposition rate may be increased to approximately 90-100 nm/min in some embodiments. The thickness of the organic zone may also be decreased to further save on process time. While a typical thickness of the organic zone in a typical process may be about 300 nm, the present techniques may reduce the thickness to as low as 25 nm. To maintain certain barrier properties, in some embodiments, the thickness of the organic zone may be approximately 100-200 nm.

A typical deposition rate for an inorganic zone in a typical thin film encapsulation process may be about 30-40 nm/min, and the inorganic material may be deposited to form a zone that is approximately 40 nm thick. In the present techniques, the deposition rate of the inorganic zone may be increased, while the inorganic zone thickness may be decreased to decrease process time while maintaining barrier properties (e.g., maintaining some standard of impermeability). For example, one standard of impermeability may be based on water vapor transmission rate, or the rate at which water vapor may transmit through a barrier coating to an encapsulated device. In some embodiments, the WVTR of a reduced process time barrier coating may be $10^{-4}$ g/m$^2$/day or less. In one or more embodiments, the inorganic deposition rate may be increased to about 60 nm/min. Further, the thickness of the inorganic zone may be decreased to over 5 nm, for example, 20-30 nm. In depositing the inorganic and organic zones, the increased deposition rate and/or the decreased zone thicknesses may contribute to reducing the process time of the reduced process time coating of the present techniques.

The number of zones in a reduced process time coating may also be reduced from a typical 5 zones of substantially organic and substantially inorganic zones. For example, in some embodiments, a reduced process time coating for an OLED structure may have only 3 zones. Furthermore, the present techniques may include only one zone or one type of material (e.g., only one inorganic zone), or any combination of variations in the number of zones, variations in thicknesses of different zones, and/or variations in deposition rates of different zones.

In one or more embodiments, the deposition rates may be modified in part by using different techniques in deposition. For example, plasma-enhanced chemical vapor deposition (PECVD) may be used to deposit the materials over the OLED device 50 and/or substrate 53 to form a graded barrier. Plasma enhanced (PE) mode deposition and/or reactive ion etch (RIE) mode deposition may be used to deposit one or more coatings, forming the reduced process time barrier of the present techniques. In a PE mode deposition, the substrate 53 or the device 50 is placed on a ground electrode in a deposition chamber. In an RIE mode deposition, the substrate 53 or the device 50 is placed on a powered electrode in a chamber. Further, variations in the excitation power of a reactor used in the deposition may change the power density of the deposition, depending on the type of reactor used, and may also vary the deposition rate. In some embodiments, different ratios or different combinations of precursor gases and/or carrier gases may also be used in the reactor chamber, which may also produce variations in deposition rates.

As depicted in the graph 80 of FIG. 4, a PE mode deposition is used for forming a substantially organic zone in a graded barrier. The graph 80 compares deposition rates 82 with different ratios 84 of a precursor gas and a carrier gas. The graph 80 also provides one example of how deposition rates may be affected by varying power density conditions (e.g., by varying the excitation powers 86, 88, and 90) and gas flow rate conditions. For example, varying excitation powers may also vary the rate at which materials are deposited, depending on other conditions, such as the type or size of a reactor chamber. The different markers indicate deposition rates across carrier gas to precursor gas ratios 84 for different excitation powers 86, 88, and 90. In one embodiment, varying the excitation powers 86, 88, and 90 may also vary the power density of the deposition, which may be measured in terms of power per area of the electrode, or power per volume of the chamber.

As seen in the graph 80, the circled mark 92 indicates that a PE mode deposition of an organic zone with a carrier gas to precursor gas ratio 84 of approximately 25 and at a first excitation power 86 may have a deposition rate of over 100 nm/min. This particular data point 92 shows an excitation power of 300 W, though power conditions may vary depending on reactor conditions, deposited materials, and desired outcomes. Compared to a typical deposition rate of an organic zone in a typical thin film encapsulation process, this faster deposition rate may be approximately 4 times greater at more than 100 nm/min. A deposition similar to the conditions described may be used in one embodiment of a reduced process time barrier coating of the present techniques to decrease the process time for thin film encapsulation.

An RIE mode deposition is used for forming an organic zone in a graded barrier, as depicted in the graph 100 of FIG. 5. Similar to the graph 80 in FIG. 4, the graph 100 compares deposition rates 82 with different ratios 84 of precursor and carrier gas. The graph 100 also compares deposition rate results with varying power conditions. The different markers indicate deposition rates across carrier gas to precursor gas ratios 84 for excitation powers of 86, 88, and 90. In RIE mode depositions, a lower carrier gas to precursor gas ratio 84 may be used to prevent the formation of brown films on the layers. The circled mark 102 indicates that an RIE mode deposition of an organic zone with a carrier gas to precursor gas ratio 84 of approximately 2 and a second excitation power 88 may have a deposition rate of about 250 nm/min. While this particular graph shows that the second excitation power 88 is at 200 W, power conditions may vary in accordance with the present techniques. Furthermore, varying the excitation power may also vary the power density used in the deposition process, which may vary depending on a type of electrode and/or chamber used in the process.

As discussed, a typical deposition rate of an organic material in a typical thin film encapsulation process may be approximately 25 nm/min. Thus, a reduced process time barrier of the present techniques may use a deposition rate that is increased by about 10 times the typical deposition rate, possibly decreasing an overall process time for producing a barrier with substantially comparable barrier capabilities.

Comparable barrier capabilities may refer to a barrier that yields similar results in protecting a structure 50 from adverse environmental conditions. In the graphs 80 and 100 in FIGS. 4 and 5, the circled marks 92 and 102 represented deposition rate increases for organic material used in a barrier coating. The barrier coating formed using the increased organic material deposition rates 92 and 102 had barrier capabilities comparable to a typical process time barrier coating. Comparable barrier properties in the examples of FIGS. 4 and 5 were based on using a calcium coupon as an encapsulated structure, as calcium is very reactive with water vapor and is often used as a test vehicle to measure barrier properties against adverse environmental conditions that may result in degradation. For example, exposure to water vapor may change calcium from opaque to transparent. Analyses of degradation to a calcium coupon may be conducted by evaluating images of the calcium over time and/or measuring the transparency of the calcium, which may provide information about water vapor ingress through a barrier film). The degradation to a calcium coupon may represent a proportional amount of degradation to electronic structures (e.g., OLEDs, photovoltaics, integrated circuitry).

Shrinkage or degradation in calcium coupon may be defined in terms of corrosion spots, or "defects," over an area of the coupon. Comparable barrier capabilities may mean that the calcium coupon has less than, for example, 5 defects/cm$^2$. This may indicate that certain electronic structures which may be coated by the present techniques may also have less than a threshold amount of defects (e.g., 5 defects/cm$^2$). Furthermore, in accordance with the present techniques, barrier capabilities may also be measured in terms of water vapor transmission rate (WVTR), or the rate at which water vapor may transmit through a barrier coating to an encapsulated device. In some embodiments, the WVTR of a reduced process time barrier coating may be $10^{-4}$ g/m$^2$/day or less.

The graphs 80 and 100 in FIGS. 4 and 5 provide some examples of different parameters that may be varied to reduce the process time in forming a barrier over a structure. Varying deposition rates may be accomplished by any combination of deposition modes (e.g., PE or RIE), excitation powers, chamber pressures, reactor types, gas flow rates and/or flow rate ratios or precursor and carrier gases, etc. Further, varying a thickness or an amount of inorganic or organic materials may also be a parameter that may reduce the process time of forming a barrier. In accordance with the present techniques, one of these parameters, or any combination of these parameters, may be used to reduce the process time in forming a barrier over a structure to substantially protect the structure from adverse environmental conditions.

Further, in one or more embodiments, different precursor gases, carrier gases, and combinations thereof may be used in the deposition of materials to form the barrier. While FIGS. 4 and 5 illustrate a graph through a range of carrier gas to precursor gas ratios, different combinations of gases may be used during different deposition modes. Furthermore, in accordance with the present techniques, different thicknesses of coatings may be desired for a graded barrier of the present techniques, and variations may be made in forming the reduced process time barrier based on different barrier thicknesses and/or configuration of the electronic device that is encapsulated by the barrier coating.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of forming a barrier coating, the method comprising:
   depositing substantially organic materials to form an organic zone at an organic material deposition rate greater than 25 nm/min, wherein the organic material deposition rate is approximately 50-100 nm/min, and wherein the organic zone is between 25-300 nm thick; and
   depositing substantially inorganic materials to form an inorganic zone, wherein a water vapor transmission rate through the barrier coating comprising the organic zone and the inorganic zone is less than $10^{-3}$ g/m$^2$/day.

2. A method of forming a barrier coating, the method comprising:

depositing substantially organic materials to form an organic zone at an organic material deposition rate greater than 25 nm/min; and depositing substantially inorganic materials to form an inorganic zone at an inorganic material deposition rate of approximately 30-60 nm/min, wherein the inorganic zone is between 20-30 nm thick, and wherein a water vapor transmission rate through the barrier coating comprising the organic zone and the inorganic zone is less than $10^{-3}$ g/m$^2$/day.

3. The method of claim 1, further comprising forming three zones in the barrier, wherein at least one of the three zones comprises organic materials and another one of the three zones comprises inorganic materials.

4. The method of claim 1, wherein the substantially organic materials and the substantially inorganic materials are deposited via a plasma-enhanced chemical vapor deposition (PECVD) technique.

5. The method of claim 1, wherein the barrier coating comprising the substantially organic materials and the substantially inorganic materials are deposited in 5 minutes or less.

6. A method of encapsulating an electronic device on a substrate, the method comprising:

determining a selected deposition rate greater than 25 nm/min; and depositing substantially organic materials at the selected deposition rate, wherein the organic materials are deposited until a thickness of an organic zone is between 25-300 nm, and wherein the substantially organic materials form part of a barrier encapsulating one or more of the electronic device and the substrate.

7. The method of claim 6, wherein determining the selected deposition rate, comprises:

determining the thickness of the organic materials to be formed;

selecting either a plasma enhanced (PE) deposition mode or a reactive ion etch (RIE) deposition mode;

configuring an excitation power in a reaction chamber based on the deposition mode selected;

selecting a ratio of precursor gas and carrier gas used in the reaction chamber based on the deposition mode selected and the excitation power configured;

selecting a chamber pressure based on the deposition mode selected and the excitation power configured;

or a combination thereof.

8. The method of claim 7, wherein the excitation power is configured such that a power density on an electrode of the electronic device is greater than 0.1 W/cm$^2$.

9. The method of claim 6, comprising depositing inorganic materials to form part of the barrier, such that the barrier is formed in 5 minutes or less.

* * * * *